(12) United States Patent
Tamura et al.

(10) Patent No.: US 12,508,766 B2
(45) Date of Patent: Dec. 30, 2025

(54) IMPRINT APPARATUS AND ARTICLE MANUFACTURING METHOD

(71) Applicant: CANON KABUSHIKI KAISHA, Tokyo (JP)

(72) Inventors: Masahiro Tamura, Tochigi (JP); Tosiya Asano, Tochigi (JP); Atsushi Kimura, Saitama (JP)

(73) Assignee: CANON KABUSHIKI KAISHA, Tokyo (JP)

(*) Notice: Subject to any disclaimer, the term of this patent is extended or adjusted under 35 U.S.C. 154(b) by 327 days.

(21) Appl. No.: 17/963,510

(22) Filed: Oct. 11, 2022

(65) Prior Publication Data
US 2023/0112689 A1 Apr. 13, 2023

(30) Foreign Application Priority Data

Oct. 13, 2021 (JP) ................................. 2021-168272

(51) Int. Cl.
B29C 59/00 (2006.01)
B29C 37/00 (2006.01)
B29C 59/02 (2006.01)

(52) U.S. Cl.
CPC .......... *B29C 59/002* (2013.01); *B29C 59/026* (2013.01); *B29C 2037/903* (2013.01)

(58) Field of Classification Search
CPC ................. B29C 59/002; B29C 59/026; B29C 2037/903; G03F 7/0002; G03F 9/7042
See application file for complete search history.

(56) References Cited

U.S. PATENT DOCUMENTS

| 8,550,801 | B2 | 10/2013 | Furutono et al. | |
| 2010/0052217 | A1* | 3/2010 | Kasumi | B82Y 40/00 264/293 |
| 2010/0173177 | A1* | 7/2010 | Wakamatsu | G11B 5/855 264/293 |
| 2016/0129612 | A1* | 5/2016 | Seki | G03F 7/0002 264/293 |
| 2016/0236400 | A1* | 8/2016 | Choi | G03F 7/0002 |

(Continued)

FOREIGN PATENT DOCUMENTS

| JP | H07142315 A | 6/1995 |
| JP | 2012060074 A | 3/2012 |

(Continued)

*Primary Examiner* — Nahida Sultana
(74) *Attorney, Agent, or Firm* — ROSSI, KIMMS & McDOWELL LLP

(57) ABSTRACT

An imprint apparatus that performs an imprint process of forming a pattern of an imprint material on a substrate using a mold, the apparatus including a control unit configured to control a mold driving unit and a substrate driving unit, and the imprint process including curing the imprint material, and releasing the mold from the cured imprint material, wherein the control unit includes a compensator configured to feedback-control driving of at least one of the mold driving unit and the substrate driving unit such that a positional relationship between the mold and the substrate in the releasing is maintained at a positional relationship between the mold and the substrate in the curing, and makes a gain of the compensator in the releasing smaller than a gain of the compensator in a step of the imprint process other than the releasing.

5 Claims, 5 Drawing Sheets

(56) References Cited

U.S. PATENT DOCUMENTS

| | | | | |
|---|---|---|---|---|
| 2016/0257060 | A1* | 9/2016 | Ito | G03F 7/0002 |
| 2017/0246657 | A1* | 8/2017 | Tamura | B05D 3/12 |
| 2017/0274418 | A1* | 9/2017 | Shiode | B05D 3/007 |
| 2018/0253000 | A1* | 9/2018 | Saito | G03F 7/0002 |

FOREIGN PATENT DOCUMENTS

| | | |
|---|---|---|
| JP | 2013091328 A | 5/2013 |
| JP | 2015204419 A | 11/2015 |
| JP | 2016154207 A | 8/2016 |
| KR | 1020100024898 A | 3/2010 |
| WO | 2011077584 A1 | 6/2011 |

* cited by examiner

IMPRINT APPARATUS AND ARTICLE MANUFACTURING METHOD

BACKGROUND OF THE INVENTION

Field of the Invention

The present invention relates to an imprint apparatus and an article manufacturing method.

Description of the Related Art

An imprint technique is a technique capable of transferring a fine nanoscale pattern, and has been proposed as one mass production lithography technique for semiconductor devices, liquid crystal display devices, magnetic storage media, or the like. An imprint apparatus using the imprint technique forms a pattern on a substrate by curing an imprint material on the substrate in a state in which a mold with the pattern formed therein and the imprint material are in contact with each other, and then releasing the mold from the cured imprint material. In general, an imprint apparatus employs, as a method of curing an imprint material, a photo-curing method in which an imprint material is cured by irradiation with light (such as ultraviolet light).

In the imprint apparatus, highly accurate alignment between the mold and the substrate is required. Therefore, in alignment between the mold and the substrate, during a period from bringing the imprint material on the substrate and the mold into contact with each other to releasing the mold, that is, during a period from pressing to mold releasing, driving units (a mold driving unit and a substrate driving unit) that hold and drive the mold and the substrate, respectively, are constantly controlled.

During the period from pressing to mold releasing, various factors cause defects in the pattern formed on the substrate. One of them is a mold releasing defect in which the pattern (transfer layer) of the imprint material on the substrate or the pattern of the mold is damaged due to a large force applied between the cured imprint material on the substrate and the mold upon mold releasing. Each of Japanese Patent Laid-Open Nos. 2012-060074 and 2013-091328 proposes a technique for reducing (suppressing) such mold releasing defects.

For example, Japanese Patent Laid-Open No. 2012-060074 discloses a technique of reducing mold releasing defects by changing, in accordance with the position in the substrate, the relative speed (mold releasing speed) between the mold and the substrate and the relative angle (mold releasing angle) between the mold and the substrate upon releasing the mold from the cured imprint material on the substrate. Japanese Patent Laid-Open No. 2013-091328 discloses a technique of performing an imprint process using a mold releasing condition, among variable conditions (mold releasing conditions) including the mold releasing speed and the mold releasing angle, which causes less mold releasing defects.

In the related art, the friction force between the cured imprint material on the substrate and the mold is decreased by controlling the mold releasing speed and the mold releasing angle, thereby reducing mold releasing defects. However, besides the friction force, there are other forces that act between the cured imprint material on the substrate and the mold and cause mold releasing defects. An example of them is a horizontal force generated in alignment between the mold and the substrate.

Further, in the imprint apparatus, in order to implement highly accurate alignment between the mold and the substrate, at least one of the mold and the substrate is moved to a target position in the horizontal direction during a period from pressing to light irradiation and, during a period after the light irradiation, maintained at a position fixed at the time of the light irradiation.

On the other hand, at the time of mold releasing, since a large force in the vertically upward direction is applied to the substrate driving unit via the cured imprint material on the substrate and the substrate, the substrate driving unit is tilted. Although it depends on the structure of the substrate driving unit, in general, the closer the mold releasing region between the cured imprint material on the substrate and the mold is to the edge of the substrate, the larger the tilt of the substrate driving unit. Even if the substrate driving unit is tilted, the horizontal positions of the mold and the substrate in the mold releasing region do not change. However, in a case in which the horizontal position of the substrate driving unit is measured by detecting the edge of the substrate driving unit, the horizontal position of the substrate driving unit changes in accordance with the tilt of the substrate driving unit. In this case, it is controlled to return the substrate driving unit to the position fixed at the time of the light irradiation, and a force in the horizontal direction is generated. Since this force in the horizontal direction acts between the cured imprint material on the substrate and the mold, it can cause mold releasing defects such as damage of the pattern of the imprint material and damage of the pattern of the mold.

SUMMARY OF THE INVENTION

The present invention provides an imprint apparatus advantageous in reducing defects generated upon releasing a mold from a cured imprint material on a substrate.

According to one aspect of the present invention, there is provided an imprint apparatus that performs an imprint process of forming a pattern of an imprint material on a substrate using a mold, the apparatus including a mold driving unit configured to hold and drive the mold, a substrate driving unit configured to hold and drive the substrate, and a control unit configured to control the mold driving unit and the substrate driving unit, and the imprint process including curing the imprint material in a state in which the mold and the imprint material on the substrate are in contact with each other, and releasing the mold from the cured imprint material on the substrate, wherein the control unit includes a compensator configured to feedback-control driving of at least one of the mold driving unit and the substrate driving unit such that a positional relationship between the mold and the substrate in a direction along a surface of the substrate in the releasing is maintained at a positional relationship between the mold and the substrate in the direction in the curing, and makes a gain of the compensator in the releasing smaller than a gain of the compensator in a step of the imprint process other than the releasing.

Further aspects of the present invention will become apparent from the following description of exemplary embodiments with reference to the attached drawings.

DESCRIPTION OF THE EMBODIMENTS

Figure 1:
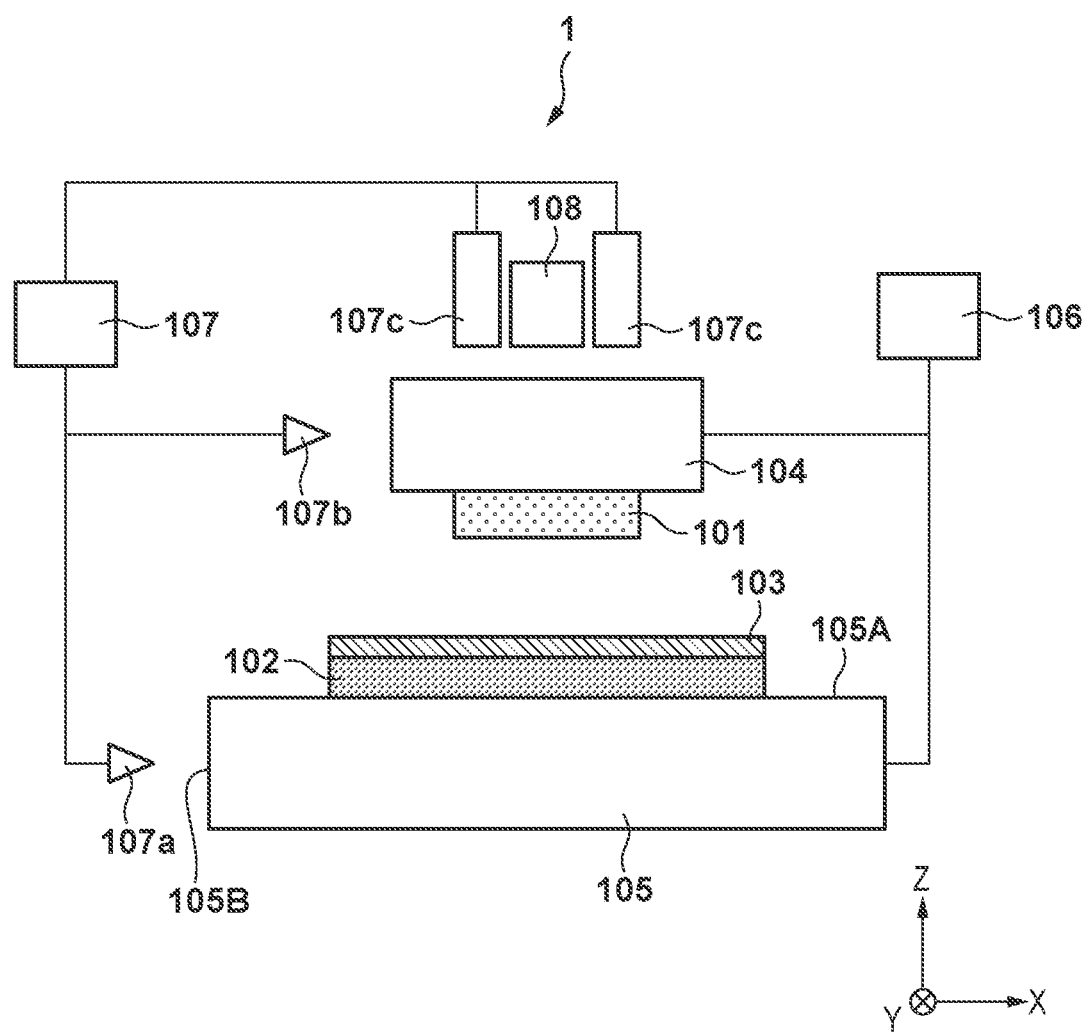
FIG. 1 is a schematic view illustrating configurations of an imprint apparatus according to an aspect of the present invention.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First Embodiment

FIG. 1 is a schematic view illustrating configurations of an imprint apparatus 1 according to an aspect of the present invention. The imprint apparatus 1 is a lithography apparatus employed in a lithography step that is a manufacturing step for a device such as a semiconductor element, a liquid crystal display element, or magnetic storage medium as an article to form a pattern on a substrate. The imprint apparatus 1 brings an uncured imprint material supplied (arranged) on a substrate into contact with a mold, and applies curing energy to the imprint material, thereby forming a pattern of a cured product to which the pattern of the mold is transferred.

As the imprint material, a material (curable composition) to be cured by receiving curing energy is used. An example of the curing energy that is used is electromagnetic waves, heat, or the like. As the electromagnetic waves, for example, infrared light, visible light, ultraviolet light, and the like selected from the wavelength range of 10 nm (inclusive) to 1 mm (inclusive) is used.

The curable composition is a composition cured by light irradiation or heating. The photo-curable composition cured by light irradiation contains at least a polymerizable compound and a photopolymerization initiator, and may contain a nonpolymerizable compound or a solvent, as needed. The nonpolymerizable compound is at least one type of material selected from a group comprising of a sensitizer, a hydrogen donor, an internal mold release agent, a surfactant, an antioxidant, a polymer component, and the like.

The imprint material may be applied in a film shape onto the substrate by a spin coater or a slit coater. The imprint material may be applied, onto the substrate, in a droplet shape or in an island or film shape formed by connecting a plurality of droplets using a liquid injection head. The viscosity (the viscosity at 25° C.) of the imprint material is, for example, 1 mPa·s (inclusive) to 100 mPa·s (inclusive).

As the substrate, glass, ceramic, a metal, a semiconductor, a resin, or the like is used, and a member made of a material different from that of the substrate may be formed on the surface of the substrate, as needed. More specifically, examples of the substrate include a silicon wafer, a semiconductor compound wafer, silica glass, and the like.

In the specification and the accompanying drawings, directions will be indicated on an XYZ coordinate system in which directions parallel to the surface of a substrate are defined as the X-Y plane. Directions parallel to the X-axis, the Y-axis, and the Z-axis of the XYZ coordinate system are the X direction, the Y direction, and the Z direction, respectively. A rotation about the X-axis, a rotation about the Y-axis, and a rotation about the Z-axis are θX, θY, and θZ, respectively.

In this embodiment, the imprint apparatus 1 employs a photo-curing method as the curing method of the imprint material. As shown in FIG. 1, the imprint apparatus 1 includes a mold driving unit 104, a substrate driving unit 105, a control unit 106, a detection system 107, and an irradiation unit 108.

The mold driving unit 104 includes, for example, a mold chuck that holds a mold 101 and a head that can support and drive the mold chuck, and has a function of holding and driving the mold 101. The substrate driving unit 105 includes, for example, a substrate chuck that holds a substrate 102 and a stage that can support and drive the substrate chuck, and has a function of driving the substrate 102 while holding the substrate 102 by a holding surface 105A.

An imprint material (transfer layer) 103 may be arranged (supplied) over the entire surface of the substrate 102 in advance. In this manner, if the imprint material 103 is arranged over the entire surface of the substrate 102 in advance, a process time can be shortened. Alternatively, the imprint material 103 may be arranged on the substrate using a dispenser (discharge device) included in the imprint apparatus 1 immediately before forming a pattern in each region (a section region where the pattern is to be formed, which is a so-called shot region) on the substrate. In this case, the imprint material 103 can be arranged in accordance with the partial unevenness of the substrate 102.

The detection system 107 includes various kinds of detectors for acquiring information concerning the positions and control forces of the respective units of the imprint apparatus 1. In this embodiment, the detection system 107 includes a detector 107a provided for the substrate driving unit 105, a detector 107b provided for the mold driving unit 104, and a detector 107c provided above the mold driving unit 104 and the substrate driving unit 105.

The detector 107a includes a sensor for detecting the substrate driving unit 105 to acquire various kinds of information concerning the position and tilt of the substrate driving unit 105. In this embodiment, the detector 107a functions as a measurement unit that measures the position and tilt of the substrate driving unit 105 by detecting the edge (the side surface of the substrate driving unit 105) 105B of the holding surface 105A of the substrate driving unit 105.

The detector 107b includes a sensor for detecting the mold driving unit 104 to acquire various kinds of information concerning the position and tilt of the mold driving unit 104. In this embodiment, the detector 107b functions as a measurement unit that measures the position and tilt of the mold driving unit 104 by detecting the edge (side surface) of the mold driving unit 104.

The detector 107c is used for alignment between the mold 101 and the substrate 102. The detector 107c includes an alignment scope or the like, and functions as a detection unit that, for example, simultaneously detects (observes) an alignment mark (first mark) provided in the mold 101 and an alignment mark (second mark) provided in the substrate 102.

The irradiation unit 108 includes a light source that emits light for curing the imprint material 103 on the substrate, for example, light such as ultraviolet light. The irradiation unit 108 irradiates the imprint material 103 with light via the mold 101 in a state in which the imprint material 103 on the substrate is in contact with the mold 101, thereby curing the imprint material 103.

The control unit 106 is formed by, for example, an information processing apparatus (computer) including a CPU, a memory, and the like, and comprehensively controls the respective units of the imprint apparatus 1 in accordance with a program stored in a storage unit or the like. The control unit 106 performs an imprint process of forming a pattern of the imprint material 103 on the substrate (each shot region thereof) using the mold 101 by controlling the operation and adjustment of each unit of the imprint apparatus 1. In this embodiment, the control unit 106 particularly controls the mold driving unit 104 and the substrate driving unit 105, and more specifically, feedback-controls them in the imprint process. Therefore, the control unit 106 includes a compensator used to feedback-control at least one of the mold driving unit 104 and the substrate driving unit 105.

The imprint process generally includes an arrangement step (supply step), a contact step (pressing step), a curing step, and a mold releasing step. The arrangement step is a step of arranging the uncured imprint material 103 on the substrate. Note that, as has been described above, in the case of arranging the imprint material 103 over the entire surface of the substrate 102 in advance, the arrangement step is omitted in the imprint process for each shot region on the substrate. Therefore, the process time can be shortened. The contact step is a step of bringing the mold 101 into contact with the imprint material 103 on the substrate. The curing step is a step of curing the imprint material 103 in a state in which the mold 101 is in contact with the imprint material 103 on the substrate. The mold releasing step is a step of releasing the mold 101 from the cured imprint material 103 on the substrate.

Figure 2A:
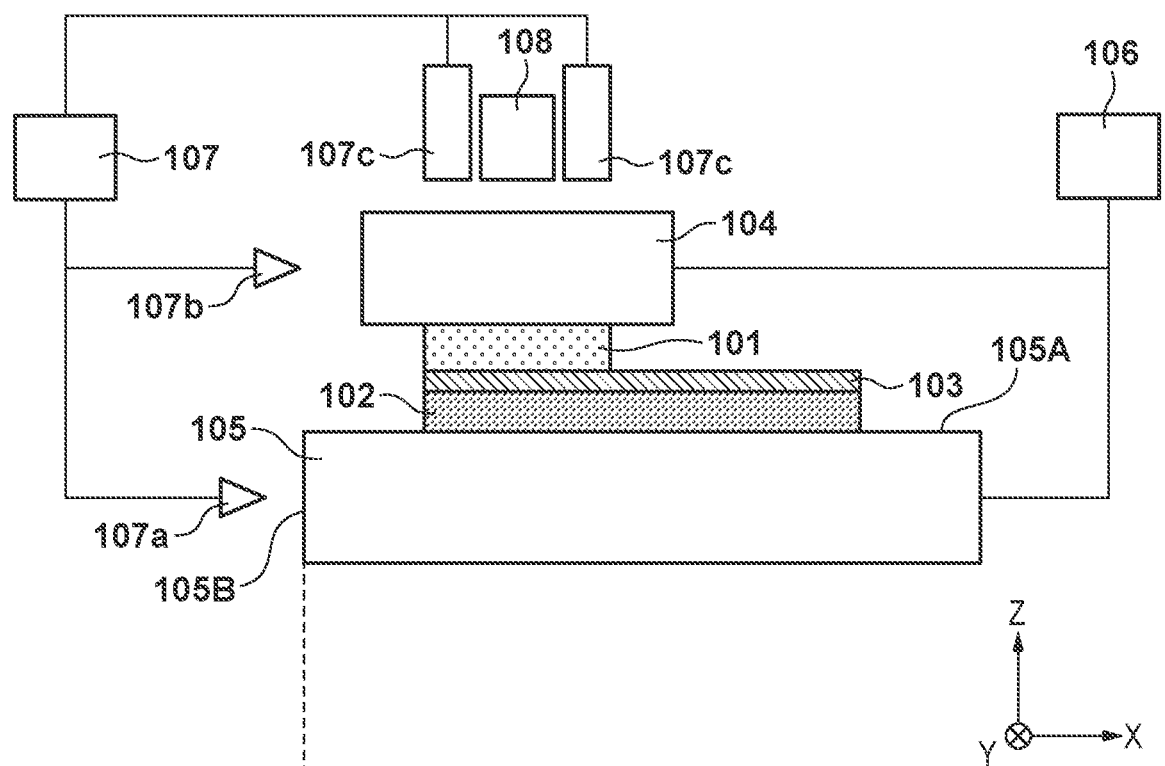
FIGS. 2A and 2B are views for describing a contact step and a mold releasing step of an imprint process.

Here, with reference to FIG. 2A, the contact step of the imprint process will be described in detail. In the contact step, the mold 101 is brought into contact with the imprint material 103 to transfer the pattern of the mold 101 to the imprint material 103 in a specific shot region (specific position) on the substrate.

More specifically, the control unit 106 first obtains, from the detection result of the detector 107*c*, the positional relationship, that is, the positional shift between the mold 101 and the substrate 102 in the horizontal direction (the direction along the surface of the substrate 102, which is the X direction in this embodiment). Then, based on the positional shift obtained from the detection result of the detector 107*c*, the mold driving unit 104 and the substrate driving unit 105 are driven in the horizontal direction to align mold 101 (pattern thereof) and the substrate 102 (shot region thereof).

Then, the mold driving unit 104 holding the mold 101 is lowered (driven in the −Z direction) so as to bring the mold 101 closer to the substrate 102, thereby bringing the mold 101 into contact with the imprint material 103 on the substrate. Even in the state in which the mold 101 is in contact with the imprint material 103 on the substrate, alignment between the mold 101 and the substrate 102 is continued based on the positional shift obtained from the detection result of the detector 107*c*.

If the accuracy of the alignment between the mold 101 and the substrate 102 falls within the predetermined accuracy, the curing step is performed. More specifically, in the state in which the mold 101 is in contact with the imprint material 103 on the substrate, light from the irradiation unit 108 is applied to the imprint material 103 via the mold 101 to cure the imprint material 103. Note that if the imprint material 103 on the substrate is cured, the control unit 106 controls the mold driving unit 104 and the substrate driving unit 105 so as to maintain the positional relationship between the mold 101 and the substrate 102 in the horizontal direction at the time of curing the imprint material 103.

Next, with reference to FIG. 2B, the mold releasing step of the imprint process will be described in detail. After the imprint material 103 on the substrate is cured, the mold driving unit 104 holding the mold 101 is lifted (driven in the +Z direction) to release the mold 101 from the cured imprint material 103 on the substrate. At this time, the substrate driving unit 105 receives a force in the direction (+Z direction) on the mold 101 side via the imprint material 103 in the mold releasing region on the substrate and the substrate 102, and is slightly tilted. Note that the mold releasing region means the region where the imprint process (mold releasing step) is being performed on the substrate, that is, the shot region.

In the mold releasing step, if the substrate driving unit 105 is tilted, a change in position of the substrate driving unit 105 in the horizontal direction is measured by the detector 107*a* which detects the edge 105B of the holding surface 105A of the substrate driving unit 105. On the other hand, in the mold releasing region, the relative position between the mold 101 and the substrate 102 in the horizontal direction does not change.

Therefore, in this embodiment, the control unit 106 calculates the current position of the mold releasing region in the horizontal direction (the positional shift between the mold 101 and the substrate 102) based on the detection result of the detector 107*a* obtained during the mold releasing step. For example, during the mold releasing step, the current position of the mold releasing region in the horizontal direction is calculated based on the position and tilt of the substrate driving unit 105 measured by the detector 107*a* and the position of the mold releasing region on the substrate in the substrate driving unit 105.

An example of calculation of the current position of the mold releasing region in the horizontal direction performed by the control unit 106 will be described. Here, the control unit 106 calculates the current center of the mold releasing region in the horizontal direction from the position and tilt of the substrate driving unit 105 and the position of the mold releasing region on the substrate in the substrate driving unit 105. Let (Ax, Ay) be the distance of the center of the mold releasing region from the farther edge of the substrate driving unit 105, and (Bx, By) and (θx, θy) be the position and tilt of the substrate driving unit 105 at that time, respectively. If the position (Bx, By) of the substrate driving unit 105 is positive, the control unit 106 calculates the center of the mold releasing region in the horizontal direction from (Bx−Ax(1−cos θ), By−Ay(1−cos θ)). If the position (Bx, By) of the substrate driving unit 105 is negative, the control unit 106 calculates the center of the mold releasing region in the horizontal direction from (Bx+Ax(1−cos θ), By+Ay(1−cos θ)).

If the substrate driving unit 105 is not tilted, the position of the mold releasing region in the horizontal direction, which is calculated by the control unit 106, and the position of the substrate driving unit 105 in the horizontal direction, which is measured by the detector 107*a*, have the same value. Therefore, when controlling the substrate driving unit 105, if the substrate driving unit 105 is not tilted, the control unit 106 may employ the position of the mold releasing region calculated by the control unit 106 and the position of the substrate driving unit 105 measured by the detector 107a.

On the other hand, if the substrate driving unit 105 is tilted, the position of the mold releasing region in the horizontal direction, which is calculated by the control unit 106, and the position of the substrate driving unit 105 in the horizontal direction, which is measured by the detector 107a, have different values. In this case, in this embodiment, the substrate driving unit 105 (at least one of the substrate driving unit 105 and the mold driving unit 104) is controlled based on the position of the mold releasing region calculated by the control unit 106. With this, in the mold releasing step, the positional relationship between the mold 101 and the substrate 102 in the horizontal direction can be maintained at the positional relationship between the mold 101 and the substrate 102 in the horizontal direction in the curing step. In this manner, if the relative position between the mold driving unit 104 and the substrate driving unit 105 in the horizontal direction in the mold releasing step is not changed from that in the curing step, a force in the horizontal direction does not act between the cured imprint material 103 on the substrate and the mold 101 in the mold releasing step. Hence, mold releasing defects such as damage of the pattern of the cured imprint material 103 on the substrate and damage of the pattern of the mold 101 can be sufficiently reduced (suppressed).

As has been described above, in this embodiment, the tilt of the substrate driving unit 105 generated in the mold releasing step is converted into the positional shift between the mold 101 and the substrate 102 in the horizontal direction, and at least one of the mold driving unit 104 and the substrate driving unit 105 is controlled based on the positional shift. More specifically, driving of at least one of the mold driving unit 104 and the substrate driving unit 105 is controlled such that the positional relationship between the mold 101 and the substrate 102 (mold releasing region) in the horizontal direction in the mold releasing step is maintained at the positional relationship between the mold 101 and the substrate 102 in the horizontal direction in the curing step. With this, it is possible to implement the imprint apparatus 1 advantageous in reducing defects generated upon releasing the mold 101 from the cured imprint material 103 on the substrate, that is, mold releasing defects.

Second Embodiment

In this embodiment, a case will be described in which a detector 107c is used to implement an imprint apparatus 1 advantageous in reducing mold releasing defects. In this embodiment, also in a mold releasing step, as in a contact step, a control unit 106 obtains the positional shift between a mold 101 and a substrate 102 in the horizontal direction from the detection result of the detector 107c, and controls a mold driving unit 104 and a substrate driving unit 105 based on the positional shift.

In order to align the mold 101 and the substrate 102, in general, a plurality of alignment marks (a plurality of first marks) are provided in the mold 101, and a plurality of alignment marks (a plurality of second marks) are provided in the substrate 102. The plurality of alignment marks (the plurality of first marks and the plurality of second marks) provided in the mold 101 and the substrate 102, respectively, are provided so as to correspond to each other, and can be detected by the detector 107c.

Figure 3A:
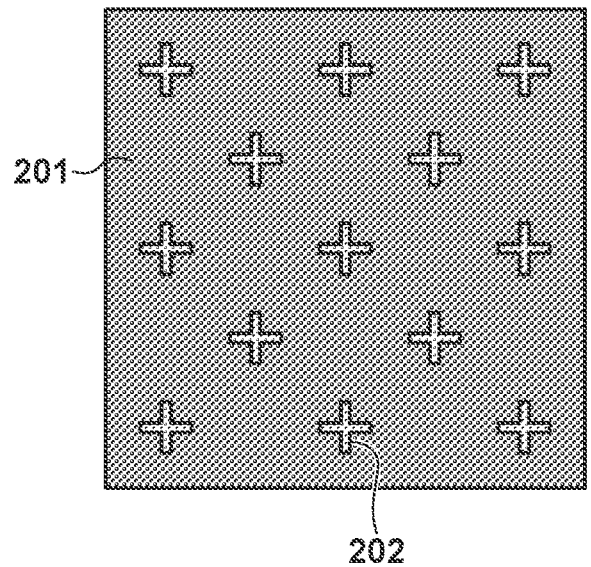
FIGS. 3A to 3D are views for describing the contact step and the mold releasing step of the imprint process.

FIG. 3A is a view showing the mold 101 viewed from above in a state in which the mold 101 is in contact with an imprint material 103 on the substrate (contact step). In the contact step, the entire region of the mold 101 is in contact with the imprint material 103 on the substrate, and the entire region of the mold 101 is a region 201 which is in contact with the imprint material 103. In this case, the detector 107c can detect all of alignment marks 202 provided in the mold 101 (and the shot region on the substrate 102). Accordingly, in the contact step, the positional shift between the mold 101 and the substrate 102 in the horizontal direction is obtained from the detection results of all the alignment marks 202, and driving of at least one of the mold driving unit 104 and the substrate driving unit 105 is controlled based on the positional shift. Hence, in the contact step, the mold 101 and the substrate 102 can be aligned with high accuracy.

Figure 3B:
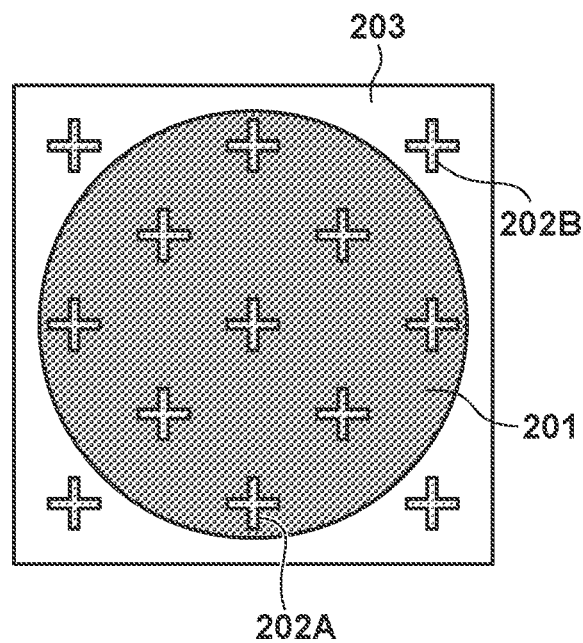

FIG. 3B is a view showing the mold 101 viewed from above in a state in which the mold 101 is being released from the cured imprint material 103 on the substrate, more specifically, in the early stage of the mold releasing step. As the mold releasing step proceeds, the region 201 where the mold 101 is in contact with the cured imprint material 103 on the substrate gradually decreases. Therefore, the alignment marks 202 include alignment marks 202A existing in the region 201, and alignment marks 202B existing in a region 203 where the mold 101 is not in contact with the cured imprint material 103 on the substrate. Since each alignment mark 202B existing in the region 203 is the alignment mark located in the region released from the cured imprint material 103 on the substrate, it is detected as an abnormal value (error) even if it is detected by the detector 107c. In general, the alignment mark is often work in a complete shape. Hence, if at least a part of the alignment mark exists in the region released from the cured imprint material on the substrate, the alignment mark is highly likely to be detected as an abnormal value.

Therefore, in this embodiment, the detection result of the alignment mark 202B existing in the region 203 is not employed in alignment between the mold 101 and the substrate 102. In other words, only the detection results of the alignment marks 202A, among the alignment marks 202 detected by the detector 107c in the mold releasing step, existing in the region 201 where the mold 101 is in contact with the cured imprint material 103 on the substrate are employed. More specifically, in the mold releasing step, the positional shift between the mold 101 and the substrate 102 in the horizontal direction is obtained from the detection results of the alignment marks 202A, and driving of at least one of the mold driving unit 104 and the substrate driving unit 105 is controlled based on the positional shift. With this, it is possible to perform alignment between the mold 101 and the substrate 102 based on a criteria similar to that in the contact step. Accordingly, the positional relationship between the mold 101 and the substrate 102 in the horizontal direction in the mold releasing step can be maintained at the positional relationship between the mold 101 and the substrate 102 in the horizontal direction in the curing step. Note that the alignment marks 202A existing in the region 201 and the alignment marks 202B existing in the region 203 can be distinguished from each other by setting a threshold value based on the abnormal value described above.

Figure 3C:
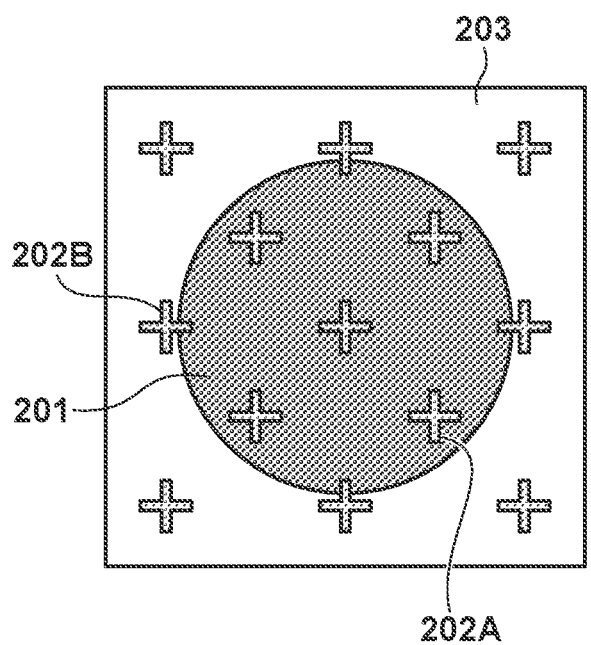

FIG. 3C is a view showing the mold 101 viewed from above in the middle stage of the mold releasing step. Also in the middle stage of the mold releasing step, as in the early stage of the mold releasing step, the detection results of the alignment marks 202B existing in the region 203 where the mold 101 is not in contact with the cured imprint material 103 on the substrate are not employed in alignment between the mold 101 and the substrate 102.

Figure 3D:
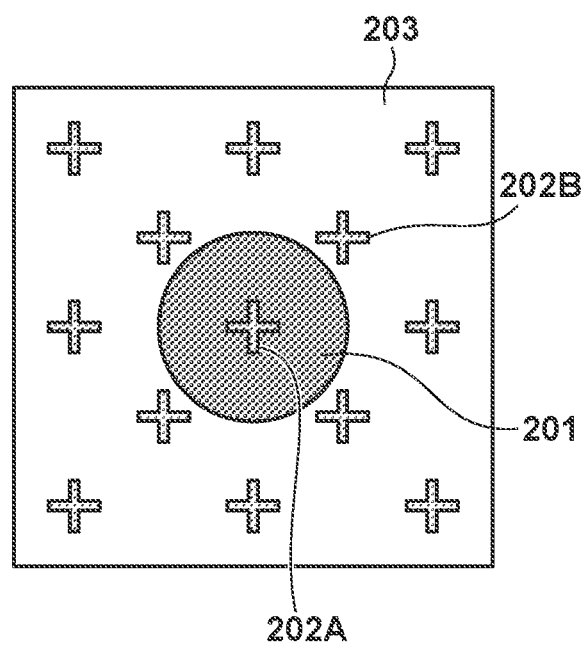

FIG. 3D is a view showing the mold 101 viewed from above in the late stage of the mold releasing step. As shown in FIG. 3D, even if there is only one alignment mark 202A in the region 201 where the mold 101 is in contact with the cured imprint material 103 on the substrate, it is possible to perform alignment between the mold 101 and the substrate 102.

As has been described above, in this embodiment, from the detection results of the detector 107c, the detection result of the alignment mark 202A existing in the region 201 where the mold 101 is in contact with the cured imprint material 103 on the substrate is extracted in the mold releasing step. Further, from the detection result of the alignment mark 202A, the positional shift between the mold 101 and the substrate 102 in the horizontal direction is obtained. Then, based on the positional shift, driving of at least one of the mold driving unit 104 and the substrate driving unit 105 is controlled such that the positional relationship between the mold 101 and the substrate 102 in the horizontal direction in the mold releasing step is maintained at the positional relationship in the curing step.

In this manner, if the relative position between the mold driving unit 104 and the substrate driving unit 105 in the horizontal direction in the mold releasing step is not changed from that in the curing step, a force in the horizontal direction does not act between the cured imprint material 103 on the substrate and the mold 101 in the mold releasing step. Hence, mold releasing defects such as damage of the pattern of the cured imprint material 103 on the substrate and damage of the pattern of the mold 101 can be sufficiently reduced (suppressed). Thus, it is possible to implement the imprint apparatus 1 advantageous in reducing defects generated upon releasing the mold 101 from the cured imprint material 103 on the substrate, that is, mold releasing defects.

Third Embodiment

In this embodiment, a case will be described in which a compensator, which is included in a control unit 106 and used to feedback-control at least one of a mold driving unit 104 and a substrate driving unit 105, is used to implement an imprint apparatus 1 advantageous in reducing mold releasing defects.

In this embodiment, the control unit 106 feedback-controls driving of at least one of the mold driving unit 104 and the substrate driving unit 105 such that the positional relationship between a mold 101 and a substrate 102 in the horizontal direction in a mold releasing step is maintained at the positional relationship in a curing step.

Here, in feedback control, a gain (gain value) which defines the ratio at which the difference between a target value and a current value is reflected on control (control force) is generally set. If the gain is large (high), the control force can be instantly output and high-speed control is enabled, but there is a risk that the control system will oscillate. On the other hand, if the gain is small (low), the control force is gradually output, so that the risk of oscillation of the control system is low, but high-speed control cannot be performed.

Figure 2B:
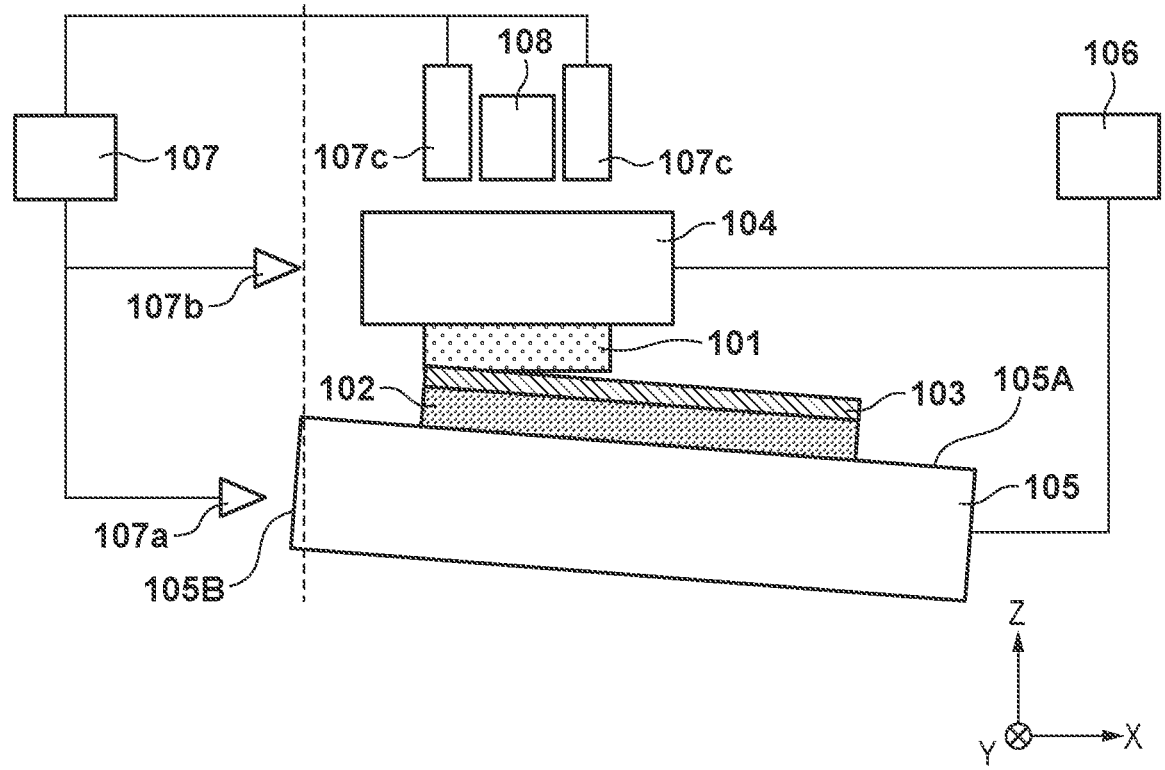

In the mold releasing step, if the substrate driving unit 105 is tilted as shown in FIG. 2B, a change in position of the substrate driving unit 105 in the horizontal direction is measured by a detector 107a which detects an edge 105B of a holding surface 105A of the substrate driving unit 105 as has been described above. Therefore, the control unit 106 outputs, to the substrate driving unit 105, a control force for returning the substrate driving unit 105 to the original position. As has been described above, the control force depends on the gain set for the compensator included in the control unit 106.

In the contact step, a large gain is often set for the compensator included in the control unit 106 to perform alignment between the mold 101 and the substrate 102 at high speed. On the other hand, in the mold releasing step, since the alignment between the mold 101 and the substrate 102 is already completed, it is only required to control the mold driving unit 104 and the substrate driving unit 105 so as to maintain their positions. Accordingly, a large gain is unnecessary.

Therefore, in this embodiment, the control unit 106 makes the gain of the compensator in the mold releasing step smaller than the gain of the compensator in the contact step. With this, the control force output from the control unit 106 to the mold driving unit 104 and the substrate driving unit 105 can be suppressed in the mold releasing step. Reducing the gain of the compensator included in the control unit 106 is advantageous if it is undesirable to perform feedback control based on the detection result of the detector 107a.

As has been described above, in this embodiment, feedback control of driving of at least one of the mold driving unit 104 and the substrate driving unit 105 is performed such that the positional relationship between the mold 101 and the substrate 102 in the horizontal direction in the mold releasing step is maintained at the positional relationship in the curing step. At this time, the gain of the compensator (the compensator included in the control unit 106) in the mold releasing step is made smaller than the gain of the compensator in the step (more specifically, the contact step) of the imprint process other than the mold releasing step. With this, the positional relationship between the mold 101 and the substrate 102 in the horizontal direction in the mold releasing step can be maintained at the positional relationship in the curing step without calculating the position of the mold releasing region in the horizontal direction by the control unit 106 as in the first embodiment. Hence, mold releasing defects such as damage of the pattern of the cured imprint material 103 on the substrate and damage of the pattern of the mold 101 can be sufficiently reduced (suppressed).

Figure 4:
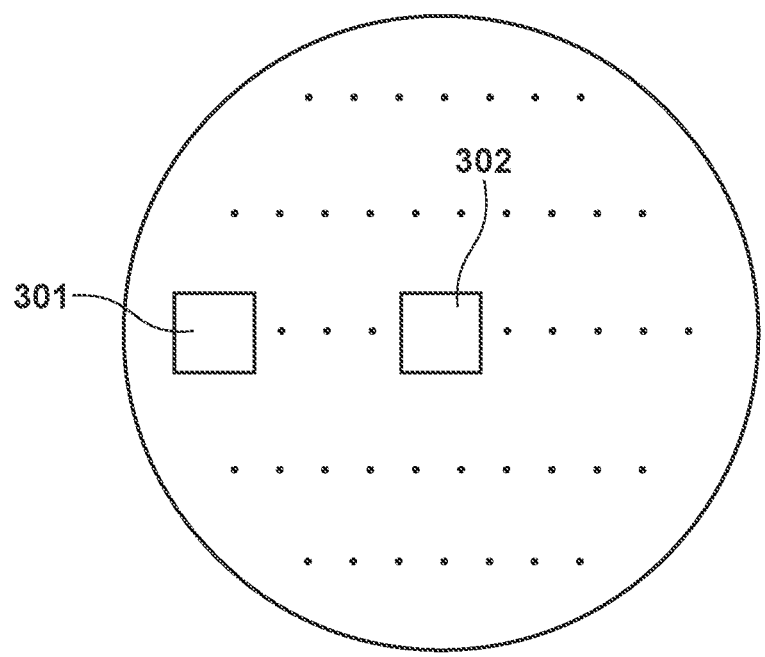
FIG. 4 is a view showing the array of shot regions on a substrate.

A case in this embodiment will be described below in which the control unit 106 includes a PID compensator as the compensator. FIG. 4 is a view showing the array of shot regions on the substrate. The imprint apparatus 1 performs the imprint process on each shot region on the substrate shown in FIG. 4. Here, as shown in FIG. 4, the shot region located in the edge of the substrate 102 is referred to as a "substrate edge region 301", and the shot region located in the central portion of the substrate 102 is referred to as a "substrate central region 302". The substrate driving unit 105 is PID-controlled by the PID compensator included in the control unit 106.

Figure 5:
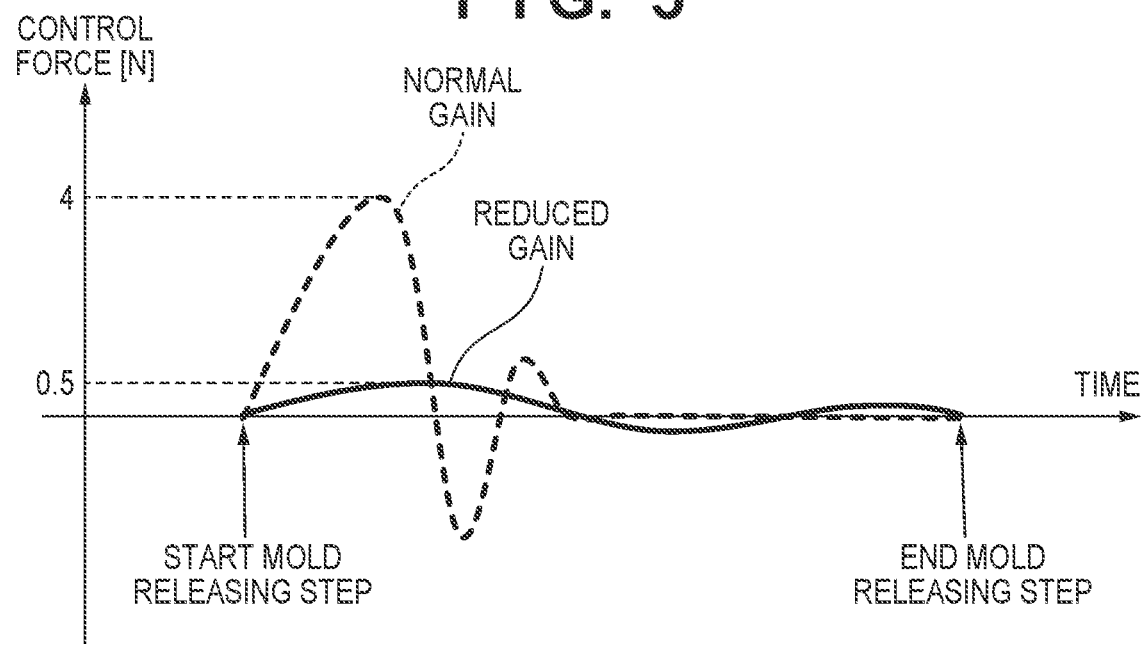
FIG. 5 is a view for describing a mold releasing step of an imprint process.

For example, assume a case in which the gain of the PID compensator in the mold releasing step is set to the gain (normal gain) of the PID compensator in the step of the imprint process other than the mold releasing step, and a case in which the gain of the PID compensator in the mold releasing step is set to the gain (reduced gain) $\frac{1}{10}$ the normal gain for each of the P value and the I value. FIG. 5 shows the control force output from the control unit 106 (PID compensator) to the substrate driving unit 105 upon performing the mold releasing step of the substrate edge region 301 for each of the above-described two cases.

Referring to FIG. 5, it can be seen that if the normal gain is set for the PID compensator, the substrate driving unit 105 reaches the target position in short time, and no control force is output thereafter, but a force of about 4 N is applied in the early stage. On the other hand, it can be seen that if the reduced gain is set for the PID compensator, the substrate driving unit 105 takes time to reach the target position, but only the control force of about 0.5 N at maximum is output throughout the mold releasing step. Note that in the substrate central region 302, the maximum control force was smaller than 1 N in both cases.

The patterns of the imprint material 103 formed on the substrate are compared between the above-described two cases. In the case in which the normal gain was set for the PID compensator, more defects were generated in the substrate edge region 301 than in the substrate central region 302. On the other hand, in the case in which the reduced gain was set for the PID compensator, the density of defects did not change between the substrate edge region 301 and the substrate central region 302.

In this manner, also in this embodiment, it is possible to implement the imprint apparatus 1 advantageous in reducing defects generated upon releasing the mold 101 from the cured imprint material 103 on the substrate, that is, mold releasing defects.

Note that for the reduced gain, if the gain is extremely reduced, when driving the substrate driving unit 105 again to perform the imprint process on the next shot region, the difference between the current position of the substrate driving unit 105 and the target position becomes large. Therefore, the substrate driving unit 105 is accelerated rapidly, but such rapid acceleration affects the durable life of the substrate driving unit 105. Hence, instead of setting the reduced gain to 0 perfectly (turning off the feedback control), the reduced gain is preferably set to 1/10 or more and 1/5 or less the normal gain. From the same reason, when the gain of the compensator reduced in the mold releasing step is returned to the original gain, it is preferable to gradually return the gain of the compensator. Note that after the imprint process on one shot region on the substrate is completed, the gain of the compensator reduced in the mold releasing step is returned by the time the imprint process on the next shot region is started.

The pattern of a cured product formed using the imprint apparatus 1 is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, an SRAM, a flash memory, and an MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

Figure 6A:
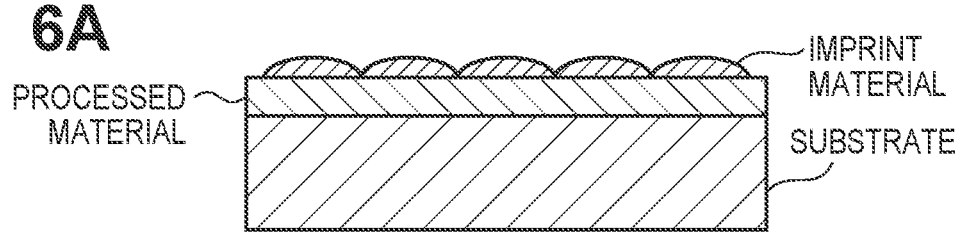
FIGS. 6A to 6F are views for describing an article manufacturing method.

Next, description regarding a detailed method of manufacturing an article is given. As illustrated in FIG. 6A, the substrate such as a silicon wafer with a processed material such as an insulator formed on the surface is prepared. Next, an imprint material is applied to the surface of the processed material by an inkjet method or the like. A state in which the imprint material is applied as a plurality of droplets onto the substrate is shown here.

Figure 6B:
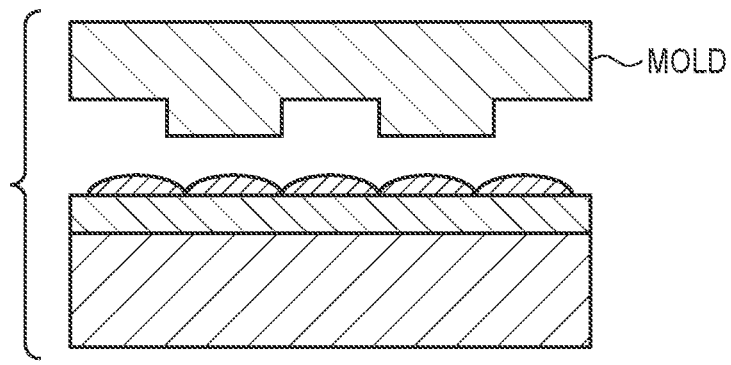
Figure 6C:
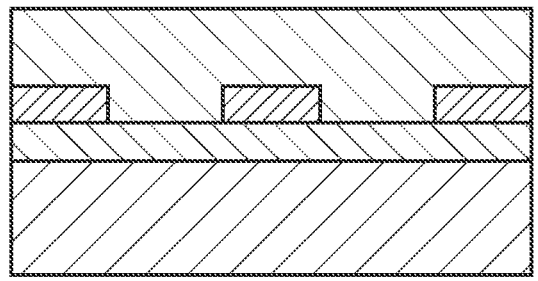

As shown in FIG. 6B, a side of the mold for imprint with a projection and groove pattern is formed on and caused to face the imprint material on the substrate. As illustrated in FIG. 6C, the substrate to which the imprint material is applied is brought into contact with the mold, and a pressure is applied. The gap between the mold and the processed material is filled with the imprint material. In this state, when the imprint material is irradiated with light serving as curing energy through the mold, the imprint material is cured.

Figure 6D:
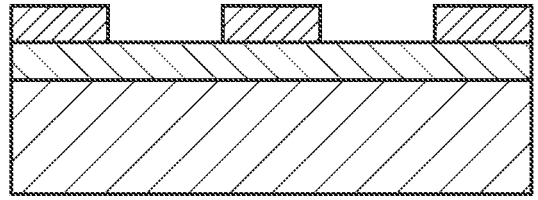

As shown in FIG. 6D, after the imprint material is cured, the mold is released from the substrate. Thus, the pattern of the cured product of the imprint material is formed on the substrate. In the pattern of the cured product, the groove of the mold corresponds to the projection of the cured product, and the projection of the mold corresponds to the groove of the cured product. That is, the projection and groove pattern of the mold is transferred to the imprint material.

Figure 6E:
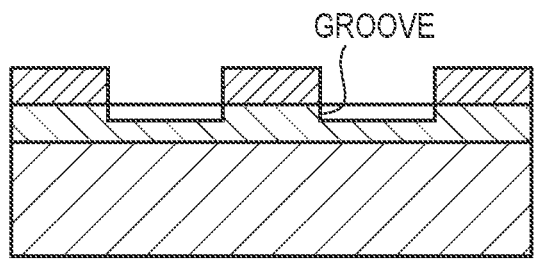
Figure 6F:
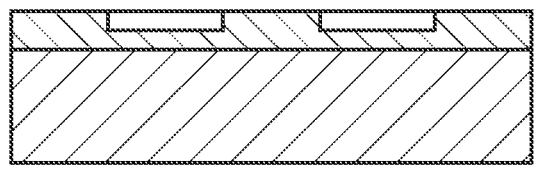

As shown in FIG. 6E, when etching is performed using the pattern of the cured product as an etching resistant mask, a portion of the surface of the processed material where the cured product does not exist or remains thin is removed to form a groove. As shown in FIG. 6F, when the pattern of the cured product is removed, an article with the grooves formed in the surface of the processed material can be obtained. The pattern of the cured material is removed here, but, for example, the pattern may be used as a film for insulation between layers included in a semiconductor element or the like without being removed after processing, in other words as a constituent member of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2021-168272 filed on Oct. 13, 2021, which is hereby incorporated by reference herein in its entirety.

What is claimed is:

1. An imprint apparatus that performs an imprint process of forming a pattern of an imprint material on a substrate using a mold, the apparatus comprising:
  a mold driving unit configured to hold and drive the mold;
  a substrate driving unit configured to hold and drive the substrate; and
  a control unit programmed to control operations of the mold driving unit and the substrate driving unit, and
the imprint process including:
  curing the imprint material in a state in which the mold and the imprint material on the substrate are in contact with each other; and
  releasing the mold from the cured imprint material on the substrate by applying a first force in a direction perpendicular to a surface of the substrate,
wherein the control unit includes a compensator programmed to perform feedback-control driving of at least one of the mold driving unit and the substrate driving unit by applying a second force in a direction parallel to the surface of the substrate, to maintain a positional relationship between the mold and the substrate in the direction parallel to the surface of the substrate in the releasing to be the same as a positional relationship between the mold and the substrate in the direction parallel to the surface of the substrate in the curing, and
wherein the control unit is further programmed to set a gain of the compensator in the releasing to be smaller than the gain of the compensator in a step of the imprint process other than the releasing to reduce a speed of feedback control driving of the at least one of the mold driving unit and the substrate driving unit in the direction parallel to the surface of the substrate during the releasing, thereby reducing generation of defects in the substrate during the releasing.

2. The apparatus according to claim 1, wherein
the imprint process includes bringing the mold and the imprint material on the substrate into contact with each other, and
the control unit is further programmed to set the gain of the compensator in the releasing to be smaller than the gain of the compensator in the bringing.

3. The apparatus according to claim 1, wherein
the control unit is further programmed to set the gain of the compensator in the releasing to be not less than $1/10$ and not more than $1/5$ the gain of the compensator in the step other than the releasing.

4. The apparatus according to claim 1, wherein
after the imprint process on one region on the substrate is completed, the control unit is further programmed to gradually return the gain of the compensator, which has been reduced in the releasing in the imprint process on the one region, by the time the imprint process on a next region is started.

5. The apparatus according to claim 1, wherein
the compensator includes a PID compensator.

* * * * *